United States Patent
Tarantino

(10) Patent No.: US 8,313,981 B2
(45) Date of Patent: Nov. 20, 2012

(54) CHIP CARD, AND METHOD FOR THE PRODUCTION THEREOF

(75) Inventor: Thomas Tarantino, Laufen (DE)

(73) Assignee: Giesecke & Devrient GmbH, Munich (DE)

( * ) Notice: Subject to any disclaimer, the term of this patent is extended or adjusted under 35 U.S.C. 154(b) by 0 days.

(21) Appl. No.: 12/988,029

(22) PCT Filed: Apr. 14, 2009

(86) PCT No.: PCT/EP2009/002732
§ 371 (c)(1),
(2), (4) Date: Oct. 15, 2010

(87) PCT Pub. No.: WO2009/127395
PCT Pub. Date: Oct. 22, 2009

(65) Prior Publication Data
US 2011/0042830 A1 Feb. 24, 2011

(30) Foreign Application Priority Data
Apr. 18, 2008 (DE) .......................... 10 2008 019 571

(51) Int. Cl.
*H01L 23/48* (2006.01)
*H01L 21/50* (2006.01)

(52) U.S. Cl. ................. 438/108; 438/125; 257/E21.499

(58) Field of Classification Search .................. 438/106, 438/108, 125, 456
See application file for complete search history.

(56) References Cited

U.S. PATENT DOCUMENTS

| | | | |
|---|---|---|---|
| 6,435,414 B1 | 8/2002 | Zafrany et al. | |
| 7,069,652 B2 | 7/2006 | Heinemann et al. | |
| 2005/0035491 A1 | 2/2005 | Bagnall et al. | |
| 2008/0251587 A1 | 10/2008 | Martinent et al. | |

FOREIGN PATENT DOCUMENTS

| | | |
|---|---|---|
| DE | 19500925 C2 | 7/1996 |
| DE | 19942932 A1 | 3/2001 |
| DE | 10016715 C1 | 9/2001 |
| DE | 202004019794 U1 | 3/2005 |
| DE | 60121974 T2 | 3/2007 |
| EP | 0706152 A2 | 4/1996 |
| EP | 1429283 A2 | 6/2004 |
| EP | 1828966 B1 | 12/2005 |
| FR | 2786009 A | 5/2000 |
| FR | 2872946 A1 | 1/2006 |

OTHER PUBLICATIONS

International Search Report in PCT/EP2009/002732, Sep. 3, 2009.

*Primary Examiner* — Alexander Ghyka
(74) *Attorney, Agent, or Firm* — Bacon & Thomas, PLLC

(57) ABSTRACT

A chip card in the form of an ID-1 card, a plug-in SIM or a USB token has a layered compound with two or three layers extending over the complete chip card. The chip card including an exterior foil layer has on its outward facing front side a communication contact layout and on its back side a flip chip, as well as a flip chip contact layout which is electroconductively connected with the communication contact layout on the front side.

15 Claims, 3 Drawing Sheets

CHIP CARD, AND METHOD FOR THE PRODUCTION THEREOF

BACKGROUND

A. Field

The invention relates to a method for producing chip cards in the form of plug-in SIMs or as standardized smart cards, in particular in the ID-1 format. The cards can also be dual interface cards or also cards with other form factors, such as for example in the form of a USB token with corresponding USB contact connectors.

B. Related Art

The production of chip cards is subject to particular cost demands. In this technical field therefore particular efforts are being made to lower the production costs. Usually chip modules are inserted in prefabricated chip card bodies, typically adhesively bonded into a gap provided in the card body for this purpose. The production of the chip modules and the production of the card bodies correspondingly are separate processes. The card bodies are produced predominantly in laminating technique as sheets or rolls, and the chip modules are inserted in the card bodies before or after the punching out of the card bodies from the foil compound.

The chip modules are usually made available on a foil substrate in the form of a carrier band and punched out of the carrier band when they are inserted in the card body, so that a part of the carrier band is also transferred. On the front side of the carrier band there are disposed ISO contact areas for contact-type communication with external communication devices, and on the back side of the carrier band there are disposed the chip and contact areas for the chip, via which the chip is connected electroconductively with the contact areas on the front side of the carrier band. Recently the chip is mounted on the contact areas on the back in flip-chip technology. Thereby the elaborate wire bonding can be done without, and also a molding in of the chip and of the sensitive wires with epoxy resin or the like can be omitted optionally.

BRIEF SUMMARY OF THE DISCLOSURE

It is the object of the present invention to further reduce the production costs of such chip cards.

Correspondingly it is provided to bond the foil substrate, which on the front side is equipped with several contact layouts for the contact-type communication and on the back side with several contact layouts and flip chips mounted or to be mounted thereon, together with at least one reinforcement layer, to form a layered compound or material, from which the individual chip cards with the final chip card dimensions then are severed.

Thus instead of punching out chip modules from the foil substrate or carrier band and inserting them in chip card bodies, the complete foil substrate with the chip modules build thereon become part of the layered compound or material in total, so that an essential production step can be economized. Correspondingly the foil substrate carrying the flip chips has a width and/or a length which corresponds to a multiple of the width or length of the chip cards to be produced therefrom. Preferably the foil substrate—and, in case the reinforcement layer is present in the form of a foil, also the reinforcement foil—is made available as sheet good or roll good.

The contact areas at least on the front side and preferably also on the back side of the foil substrate are advantageously realized as a metallization of the foil surface. Therein the corresponding contact layout can be produced from an originally full-area metallization for example through etching or additive etching. The contact layout on the back side can in addition have the necessary components of a coil for the additional contactless data exchange and/or the contactless energy supply the card (dual interface card).

The layered compound advantageously can consist only of the two above-mentioned layers. According to a preferred embodiment, however, an intermediate foil is arranged between the foil substrate and the reinforcement layer, so as to protect the flip chip in the final card against mechanical loads. For this purpose the intermediate foil, according to a first variant, can have gaps in which the flip chips come to lie. The depth of the gap preferably corresponds approximately to the thickness of the flip chip, i.e. it can also be slightly deeper, but in any case should not be shallower than the flip chip structure on the foil substrate. The gaps of the intermediate foil can advantageously be present in the form of through openings in the intermediate foil, which can be produced cost-effectively for example through punching out.

According to a second variant for the protection of the flip chips a material can be chosen for the intermediate foil which is softer than the materials of the foil substrate and a reinforcement foil bonded thereto. The flip chips can be embedded in such an intermediate foil material when the foil layers are bonded to form the layered compound. As material for the intermediate foil a correspondingly flexible and plastically deformable material lends itself, in particular a foam material.

In the case that an intermediate foil is provided the foil compound preferably consists only of the three mentioned layers so as to keep the production expense low, but if required it can also consist of more than only three foil layers.

When bonding the foil layers to form a foil compound adhesives can be used. In the case of thermoplastic foil layers the use of adhesives can be omitted. It is advantageous in any case, however, to carry out the laminating of the foil layers to form a foil compound applying increased pressure and increased temperature, in particular when thermoplastic foil layers are bonded to each other without using an adhesive.

Instead of making the reinforcement layer available as a foil, according to another embodiment of the invention it can be produced alternatively as an injection-molded layer by back injection molding of the foil substrate—or, if applicable, of the intermediate foil.

The thickness of the layered compound is preferably chosen in such a fashion that it corresponds to the ISO standard thickness of ID-1 chip cards or corresponding plug-in SIMs. However, they can also have different dimensions, for example have the form of USB tokens. As USB token the exterior contact areas are configured for communication with USB interfaces, and the dimensions of the chip card are chosen such that the card can be plugged with its USB interface into a USB connector. Here the ISO standard thickness can in particular be exceeded.

The chip cards can be personalized and/or printed in a further method step, with this method step for cost reasons preferably taking place before the severing of the chip cards from the layered compound.

DESCRIPTION OF THE DRAWINGS

The invention will hereinafter be described by way of example with reference to the accompanying drawings. The figures are described as follows.

DETAILED DESCRIPTION OF THE PREFERRED EMBODIMENTS OF THE INVENTION

Figure 1:
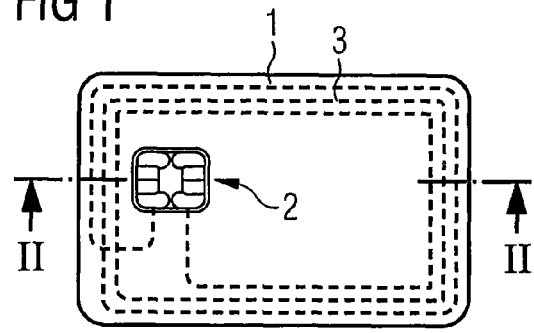
FIG. 1 a chip card in the ID-1 format schematically in a plan view.

FIG. 1 shows schematically in a plan view a chip card 1 in the ID-1 format with an exterior contact layout 2 for the contact-type communication with and/or energy supply through external data processing devices, such as for example payment terminals, access control devices, computers and the like. The chip card 1 here is configured as a dual interface card and correspondingly has a coil 3 integrated in the chip card for contactless data- and/or energy transmission, said coil being represented in FIG. 1 by dashed lines. The chip card 1 of FIG. 1 instead of an ID-1 chip card can also have other form factors, for example those of a plug-in SIM, but then as a rule without the coil 3.

Figure 2:
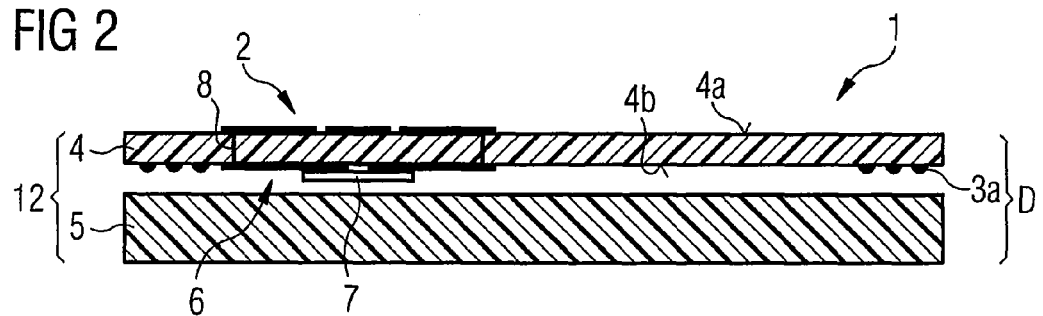
FIG. 2 the layer structure of the chip card of FIG. 1 schematically in cross section, FIG. 3 an alternative layer structure of the chip card of FIG. 1 in cross section, FIG. 4 a further alternative structure of the chip card of FIG. 1 schematically in cross section, FIG. 5 the steps for producing the chip card of FIG. 1 schematically in a roll-to-roll process, FIG. 6 a chip card in the format of a USB token, FIG. 7 a further alternative layer structure of the chip card of FIG. 1 schematically in cross section and FIG. 8 a strip-shaped layered compound in accordance with FIG. 7 in a plan view, from which several chip cards have already been severed.
Figure 3:
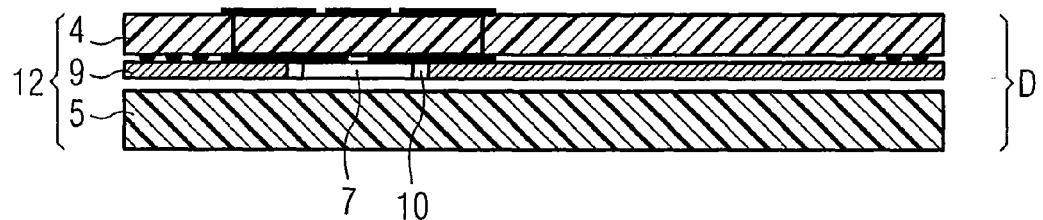
Figure 4:
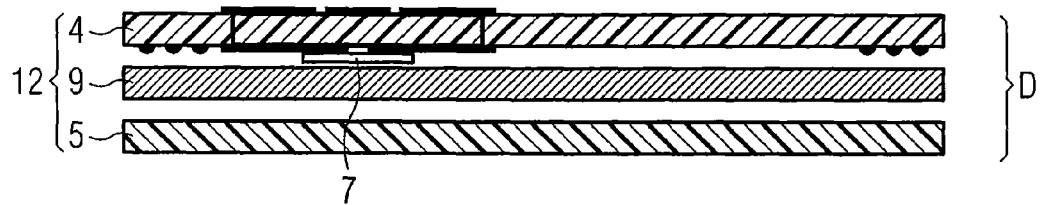

FIGS. 2 to 4 show the chip card of FIG. 1 according to three embodiments schematically in cross section. In the first embodiment according to FIG. 2 the chip card 1 is realized as a two-layer layered compound 12 and comprises as first layer a foil substrate 4 and as second layer a reinforcement foil 5. On the front side 4a of the foil substrate 4 there is provided the communication contact layout 2 for contact-type communication, having the form of an etched metallization. On the back side 4b of the foil substrate 4 a second or flip chip contact layout 6 is disposed, on which a flip chip 7 is mounted in conventional flip chip technology. The connectors of the flip chip 7, which are not represented here in detail, are connected electroconductively through the flip chip contact layout 6 and furthermore through vias 8 penetrating the foil substrate 4 with the communication contact layout 2 disposed on the front side of the foil substrate 4a. Also the flip chip contact layout 6 is realized e.g. as an etched metallization. Simultaneously with the production of the flip chip contact layout 6 the turns 3a of the coil 3 (by the exception of the "bridge" spanning the turns of the coil) were produced, thus equally preferably as an etched metallization.

The foil layers 4, 5 have a total thickness D corresponding to the thickness of the finished card. The bonding of the two foil layers 4, 5 to the finished layered compound or material 12 with the total thickness D takes place applying increased pressure and increased temperature. In the case that as materials for the two foil layers 4, 5 suitable thermoplastics are used, in this fashion a firm bond of the two layers can be achieved without using an additional adhesive. In the case that incompatible thermoplastics and/or a thermosetting plastic is/are used for the one and/or the other foil layer it is expedient to use an adhesive, however. In particular in the case of a thermo-activatable adhesive also here the use of increased pressure and increased temperature is sensible.

The second embodiment according to FIG. 3 differs from the embodiment of FIG. 2 only in that the layered compound 12 has as third foil layer an intermediate foil 9 between the foil substrate 4 and the reinforcement foil 5. The intermediate foil 9 has a gap 10 in which the flip chip 7 is accommodated for protection against mechanical loads. The intermediate foil 9 with the gap 10 can be omitted if the flip chip 7 is very thin and flexible, as is the case with the embodiment according to FIG. 2. It is also conceivable in the embodiment in accordance with FIG. 2 to provide a gap in the reinforcement foil 5 for accommodating the flip chip 7. This accommodation would then correspondingly have the depth of the thickness of the flip chip 7 or of the flip-chip structure, or slightly above. However, since providing such gaps is elaborate and correspondingly expensive, the use of the intermediate foil 9 in the case of thicker and/or more inflexible flip chips 7 is advantageous, since the gap 10 in this case can be produced as a through opening, simply for example in a punching step. Since the depth of the gap corresponds merely to the thickness of the flip chip 7 or of the flip chip structure, or slightly above, the intermediate foil 9 can be chosen with a correspondingly small thickness.

The third embodiment in accordance with FIG. 4 shows a different variant for the protection of a comparatively thick and/or inflexible flip chip 7 against mechanical loads. Again there is provided an intermediate foil 9 between the foil substrate 4 and the reinforcement foil 5. In this case the intermediate foil 9, however, does not have a gap, but consists of a material which is softer than the materials of the foil substrate 4 and the reinforcement foil 5. This is valid at least for the time of bonding of the three foil layers to form the three-layer layered compound 12. Thus the intermediate foil 9 can for example have a lower softening point than the foil substrate 4 and the reinforcement foil 5, so that when the layers are laminated in increased temperature it is substantially softer than the foil layers of the foil substrate 4 and the reinforcement foil 5. In this fashion the flip chip 7 can be embedded in the intermediate foil 9.

The intermediate foil 9 can in particular also consist of a foam material, which is hot or cold bonded to the other two foil layers 4, 5. The section of the flip chip 7 can be kept free of adhesive during adhesive bonding, so that there is no fixed bonding between the flip chip 7 and the intermediate layer 9. Thereby the flip chip 7 is mechanically decoupled from the intermediate layer 9.

Figure 5:
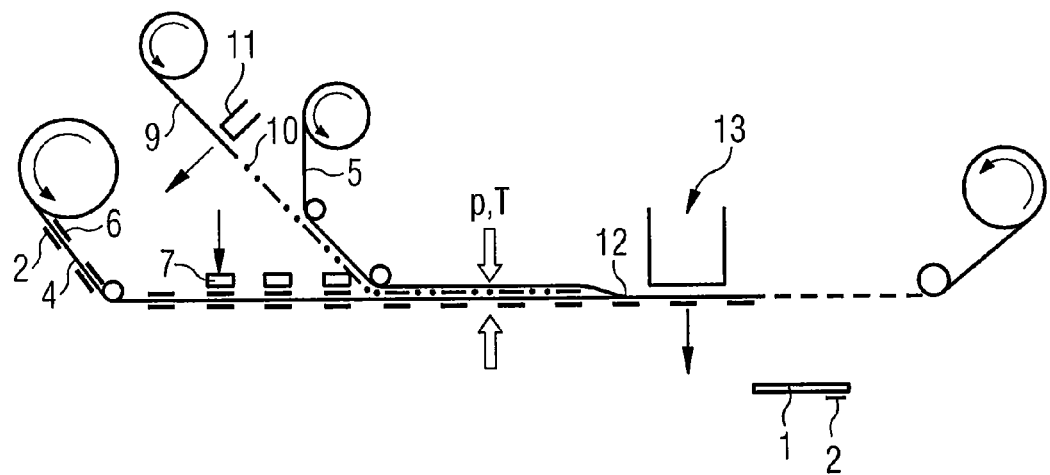

FIG. 5 shows by way of example the production of the chip cards 1 in a roll-to-roll method. In a corresponding fashion the chip cards 1 can also be produced from foil layers made available in the form of sheets.

The method starts with providing a foil substrate 4, on which at least the communication contact layout 2 and the flip chip contact layout 6 are present and are electroconductively connected with each other by means of the vias 8 (FIG. 2). As far as not already present, firstly flip chips 2 are mounted on the flip chip contact layouts 6. Subsequently the foil substrate 4 is joined with the reinforcement foil 5 and—in this case— the intermediate foil 9. Before the joining in a first punching station 11 gaps 10 are punched out from the intermediate foil 9, in which subsequently the flip chips 7 come to lie. The foil layers 4, 5, 9 are subsequently laminated using increased pressure p and increased temperature T to form a layered compound 12. From the layered compound 12 in a second punching station 13 the chip cards 1 are then punched out. The rest of the foil compound 12 is wound onto a waste reel. The chip cards 1 can be personalized and/or printed before the severing in a corresponding station not represented here, e.g. through laser inscription.

Figure 6:
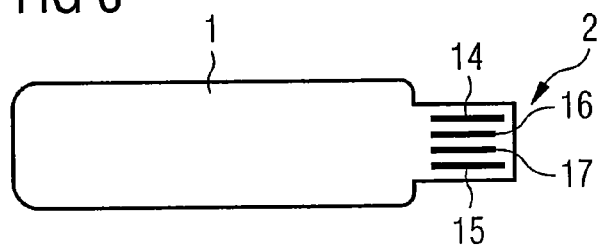

FIG. 6 shows a chip card 1 in the form of a USB token. The contact layout 2 for the contact-type communication with and current supply through an external device comprises the two protruding outer pins 14, 15 for the supply voltage and the shorter pins 16, 17 for the data traffic.

Figure 7:
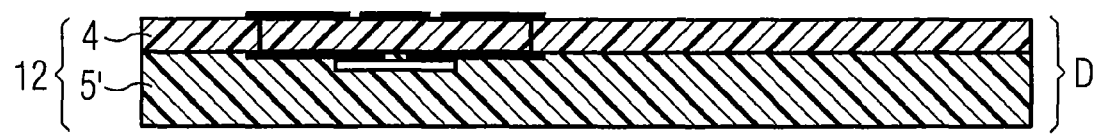
Figure 8:
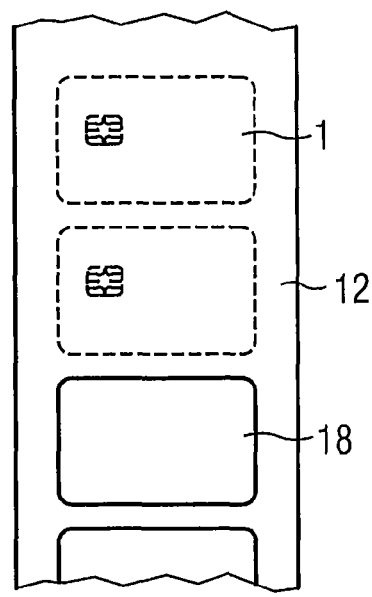

FIG. 7 shows schematically in cross section a further embodiment for a layer structure 12, which differs from the embodiments according to FIGS. 2 to 4 essentially in that instead of the reinforcement foil 5 there is provided an injection-molded layer 5' as reinforcement layer, so as to form the layered compound 12. An intermediate foil 9 with gaps 10 for accommodating the flip chips 7 as described with reference to FIG. 3 can be provided additionally. The bonding of the injection-molded layer 5' with the foil substrate 4—or alternatively with the intermediate layer 9—can be realized in a simple fashion in that the foil substrate 4 is back injection molded with the injection molding material of the injection molding layer 5'. For this purpose either the complete foil substrate 4 with the flip chips 7 mounted on it can be back injection molded. However, alternatively the foil substrate 4 can also be cut into strips and then be back injection molded with the injection molding layer 5'. Such a strip is shown in FIG. 8. From the strip-shaped layered compound 12 the chip cards 1 are then severed, for example punched out, and there remain corresponding holes 18 in the layered compound 12.

The invention claimed is:

1. A method for producing chip cards, comprising the steps:
   providing a foil substrate with a front side and a back side, with several communication contact layouts for contact-type communication of the chip cards to be produced with external communication devices on the front side and several flip chip contact layouts for connecting respectively at least one flip chip on the back side, and wherein the several flip chip contact layouts are electro-conductively connected with respectively one of the several communication contact layouts;
   if the several flip chip contact layouts are not already equipped with flip chips, mounting flip chips onto the flip chip contact layouts;
   providing a reinforcement layer, wherein the reinforcement layer comprises a reinforcement foil;
   providing an intermediate foil and arranging the intermediate foil between the foil substrate and the reinforcement foil;
   bonding the foil substrate fitted with the at least one flip chip with the reinforcement foil and intermediate foil to form a layered material; and
   severing individual chip cards with chip-card end product dimensions from the layered material,
   wherein the intermediate foil comprises a material which is softer than the materials of the foil substrate and of the reinforcement foil, and wherein, during the bonding to form the layered material, the flip chips are embedded in the intermediate foil.

2. The method according to claim 1, wherein the foil substrate is provided with coils provided on the back side which are in contact or are brought into contact with the flip chips or flip chip contact layouts or providing such a coil on the back side of the foil substrate.

3. The method according to claim 1, wherein the intermediate foil includes gaps accommodating the flip chips and is arranged between the foil substrate and the reinforcement foil so that a respective flip chip is disposed in the gap.

4. The method according to claim 3, wherein a depth of the gaps of the intermediate foil is chosen such that it corresponds to the thickness of a respective flip chip.

5. The method according to claim 3, wherein the intermediate foil is configured so that the gaps are defined by through openings in the intermediate foil.

6. The method according to claim 1, wherein the material of the intermediate foil comprises a foam material.

7. The method according to claim 1, wherein the foil material comprises only the three foil layers.

8. The method according to claim 1, wherein the reinforcement layer further comprises injection molded material, which is bonded to the foil substrate by back injection molding of the foil substrate.

9. The method according to claim 1, wherein the step of bonding to form a layered material comprises application of pressure and temperature.

10. The method according to claim 1, wherein the thickness of the layered compound is selected so that it corresponds to the ISO thickness of ID-1 chip cards.

11. The method according to claim 1, wherein the chip-card final product dimensions correspond to the dimensions of plug-in SIMs or ID-1 chip cards.

12. The method according to claim 1, wherein the chip cards are severed from the layered material in the form of USB tokens.

13. The method according to claim 1, including the step of personalizing the chip cards.

14. The method according to claim 13, wherein the step of personalizing the chip cards takes place before the step of severing of the chip cards from the layered material.

15. The method according to claim 1, wherein the foil substrate comprises sheet material or roll material.

* * * * *